US010304967B1

(12) United States Patent
Venugopal et al.

(10) Patent No.: US 10,304,967 B1
(45) Date of Patent: May 28, 2019

(54) INTEGRATION OF GRAPHENE AND BORON NITRIDE HETERO-STRUCTURE DEVICE OVER SEMICONDUCTOR LAYER

(71) Applicant: Texas Instruments Incorporated, Dallas, TX (US)

(72) Inventors: Archana Venugopal, Dallas, TX (US); Luigi Colombo, Dallas, TX (US); Arup Polley, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/910,854

(22) Filed: Mar. 2, 2018

(51) Int. Cl.
*H01L 31/0312* (2006.01)
*H01L 29/786* (2006.01)
(Continued)

(52) U.S. Cl.
CPC .... *H01L 29/78696* (2013.01); *H01L 21/0254* (2013.01); *H01L 21/02527* (2013.01); *H01L 21/02614* (2013.01); *H01L 21/8258* (2013.01); *H01L 27/092* (2013.01); *H01L 29/1606* (2013.01); *H01L 29/2003* (2013.01); *H01L 29/267* (2013.01); *H01L 29/45* (2013.01); *H01L 29/4908* (2013.01); *H01L 29/66742* (2013.01); *H01L 29/78618* (2013.01); *H01L 29/78648* (2013.01); *H01L 29/78681* (2013.01); *H01L 29/78684* (2013.01); *H01L 21/02378* (2013.01); *H01L 21/02381* (2013.01); *H01L 21/02389* (2013.01); *H01L 21/02395* (2013.01); *H01L 21/02488* (2013.01)

(58) Field of Classification Search
None
See application file for complete search history.

(56) References Cited

U.S. PATENT DOCUMENTS 7,732,859 B2 6/2010 Anderson
7,858,989 B2 12/2010 Chen
(Continued)

OTHER PUBLICATIONS

Venugopal et al., "Integration of Graphene and Boron Nitride Hetero-Structure Device", U.S. Appl. No. 15/910,817, filed Mar. 2, 2018.
(Continued)

*Primary Examiner* — Kevin M Picardat
(74) *Attorney, Agent, or Firm* — Andrew R. Ralston; Charles A. Brill; Frank D. Cimino

(57) ABSTRACT

A microelectronic device includes a gated graphene component over a semiconductor material. The gated graphene component includes a graphitic layer having at least one layer of graphene. The graphitic layer has a channel region, a first connection and a second connection make electrical connections to the graphitic layer adjacent to the channel region. The graphitic layer is isolated from the semiconductor material. A backgate region having a first conductivity type is disposed in the semiconductor material under the channel region. A first contact field region and a second contact field region are disposed in the semiconductor material under the first connection and the second connection, respectively. At least one of the first contact field region and the second contact field region has a second, opposite, conductivity type. A method of forming the gated graphene component in the microelectronic device with a transistor is disclosed.

20 Claims, 10 Drawing Sheets

(51) Int. Cl.
*H01L 29/20* (2006.01)
*H01L 29/267* (2006.01)
*H01L 29/49* (2006.01)
*H01L 29/45* (2006.01)
*H01L 29/66* (2006.01)
*H01L 21/02* (2006.01)
*H01L 21/8258* (2006.01)
*H01L 27/092* (2006.01)
*H01L 29/16* (2006.01)

(56) References Cited

U.S. PATENT DOCUMENTS

| | | |
|---|---|---|
| 7,858,990 B2 | 12/2010 | Chen |
| 8,247,806 B2 | 8/2012 | Chae |
| 8,673,703 B2 | 3/2014 | Lin |
| 8,698,226 B2 | 4/2014 | Jain |
| 8,703,558 B2 | 4/2014 | Liang |
| 8,957,405 B2 | 2/2015 | Adkisson |
| 9,048,310 B2 | 6/2015 | Lee |
| 9,130,567 B2 | 9/2015 | Yun |
| 9,166,099 B2 | 10/2015 | Hwang |
| 9,401,435 B2 | 7/2016 | Lee |
| 9,786,797 B2 | 10/2017 | Harada |
| 9,882,008 B2 | 1/2018 | Colombo et al. |
| 2009/0140801 A1 | 6/2009 | Ozyilmaz |
| 2011/0089404 A1 | 4/2011 | Marcus |
| 2012/0049160 A1 | 3/2012 | Sano |
| 2012/0168722 A1* | 7/2012 | Chung ............. H01L 29/1606 257/29 |
| 2014/0239257 A1* | 8/2014 | Moon ............. H01L 29/78684 257/29 |
| 2015/0280011 A1* | 10/2015 | Cho ............. H01L 29/78684 257/29 |
| 2016/0005894 A1 | 1/2016 | Zhang |
| 2016/0111180 A1* | 4/2016 | Joo ............. H01B 1/04 428/408 |
| 2017/0229587 A1 | 8/2017 | Lee |
| 2017/0345944 A1* | 11/2017 | Lin ............. H01L 29/778 |
| 2018/0130912 A1* | 5/2018 | Tateno ............. H01L 21/02614 |

OTHER PUBLICATIONS

Colombo et al., "Low Contact Resistance Graphene Device Integration", U.S. Appl. No. 15/496,814, filed Apr. 25, 2017.

\* cited by examiner

INTEGRATION OF GRAPHENE AND BORON NITRIDE HETERO-STRUCTURE DEVICE OVER SEMICONDUCTOR LAYER

FIELD

This disclosure relates to the field of microelectronic devices. More particularly, this disclosure relates to graphene in microelectronic devices.

BACKGROUND

Graphene is a promising material for microelectronic devices. A commonly proposed architecture for a gated graphene component is a graphitic layer containing graphene on a substrate, with metal contacts on the graphene and a channel region in the graphene between the contacts. This architecture suffers from lack of control over carrier density in the graphene in the channel region and under the contacts. Carrier density in the channel region may be modulated to operate the gated graphene component, while it is desirable to maintain a high carrier density under the contacts, in order to reduce the parasitic resistance of the device. Attaining independent control of the carrier density under the contacts in a structure that can be integrated into a microelectronic device with other components such as transistors has been challenging.

SUMMARY

The present disclosure introduces a microelectronic device which includes a gated graphene component over a semiconductor material. The gated graphene component includes a graphitic layer containing one or more layers of graphene. The graphitic layer has a channel region, a first contact region adjacent to the channel region and a second contact region adjacent to the channel region. The graphitic layer is isolated from the semiconductor material. A backgate region having a first conductivity type is disposed in the semiconductor material under the channel region. A first contact field region is disposed in the semiconductor material under the first contact region of the graphitic layer, and a second contact field region is disposed in the semiconductor material under the second contact region of the graphitic layer. At least one of the first contact field region and the second contact field region has a second, opposite, conductivity type. A method of forming the gated graphene component in the microelectronic device with a transistor is disclosed.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device includes a gated graphene component having a graphitic layer that contains one or more layers of graphene. The graphitic layer includes a channel region, a first contact region adjacent to the channel region and a second contact region adjacent to the channel region. The graphene extends from the channel region into the first contact region and the second contact region. The graphitic layer is disposed over a semiconductor material, and is isolated from the semiconductor material. The semiconductor material under the graphitic layer has a backgate region under the channel region, a first contact field region under the first contact region, and a second contact field region under the second contact region. The backgate region has a first conductivity type, and at least one of the first contact field region and the second contact field region has a second, opposite, conductivity type. The gated graphene component includes a gate over the channel region, opposite from the backgate region. Electrical connections to the graphitic layer are made in the first contact region and the second contact region.

Terms such as top, bottom, front, back, over, above, under, and below may be used in this disclosure. These terms should not be construed as limiting the position or orientation of a structure or element, but should be used to provide spatial relationship between structures or elements.

For the purposes of this disclosure, it will be understood that, if an element is referred to as being "on" another element, it may be directly on the other element, or intervening elements may be present. Similarly, if an element is referred to as being "adjacent to" another element, it may be directly adjacent to the other element, or intervening elements may be present.

Figure 1:
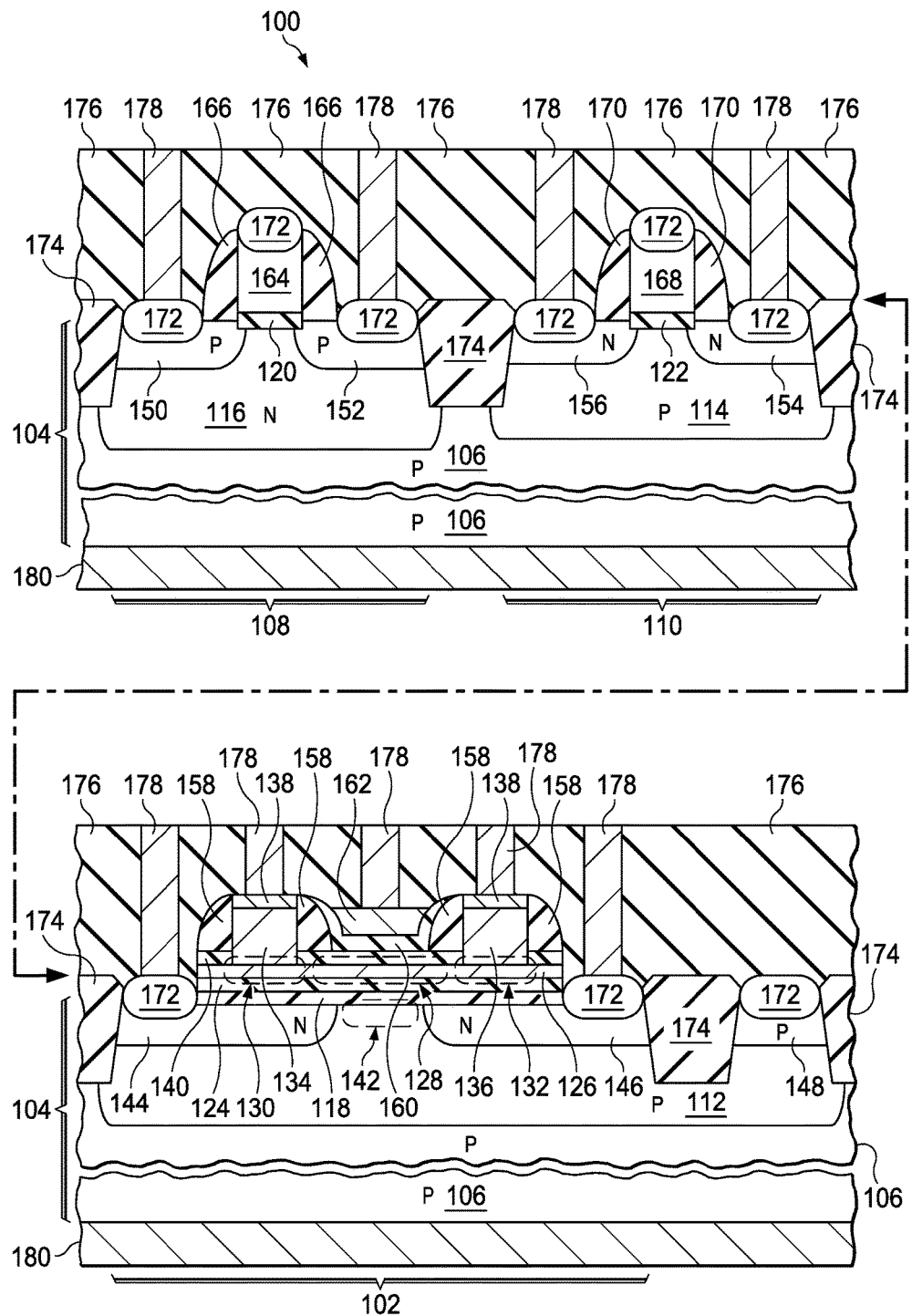
FIG. 1 is a cross section of an example microelectronic device which includes a gated graphene component.

FIG. 1 is a cross section of an example microelectronic device 100 which includes a gated graphene component 102. The microelectronic device 100 includes a substrate 104 having a semiconductor material 106 such as silicon or primarily silicon, silicon carbide, gallium arsenide, gallium nitride, or the like. The substrate 104 may be a portion of a semiconductor wafer, for example, a single crystal silicon wafer, possibly with an epitaxial layer, or a silicon on insulator (SOI) wafer. In some versions of the instant example, the semiconductor material 106 may be p-type, as indicated in FIG. 1. In other versions, the semiconductor material 106 may be n-type. In addition to the gated graphene component 102, the microelectronic device 100 of the instant example includes a p-channel metal oxide semiconductor (PMOS) transistor 108 and an n-channel metal oxide semiconductor (NMOS) transistor 110.

There may be an optional graphene component well 112 in the semiconductor material 106 under the gated graphene component 102. In some versions of the instant example, the graphene component well 112 may be p-type, as indicated in FIG. 1. In other versions, the graphene component well 112 may be n-type. In the instant example, there is a p-type well 114 in the semiconductor material 106 under the NMOS transistor 110. In versions of the instant example in which the graphene component well 112 is p-type, a distribution of p-type dopants in the graphene component well 112 may be substantially equal to a distribution of p-type dopants in the p-type well 114, as a result of being formed concurrently.

Similarly, in the instant example, there is an n-type well 116 in the semiconductor material 106 under the PMOS transistor 108. In versions of the instant example in which the graphene component well 112 is n-type, a distribution of n-type dopants in the graphene component well 112 may be substantially equal to a distribution of n-type dopants in the n-type well 116, as a result of being formed concurrently.

The gated graphene component 102 of the instant example includes an isolation dielectric layer 118 over the semiconductor material 106. The isolation dielectric layer 118 may include, for example, silicon dioxide, hafnium oxide, tantalum oxide, or zirconium oxide, and may have a thickness of 2 nanometers to 10 nanometers. The PMOS transistor 108 includes a PMOS gate dielectric layer 120, and the NMOS transistor 110 includes an NMOS gate dielectric layer 122. The isolation dielectric layer 118 may a thickness and a composition substantially equal to at least one of the PMOS gate dielectric layer 120 and the NMOS gate dielectric layer 122, as a result of being formed concurrently.

The gated graphene component 102 may include a lower hexagonal boron nitride (hBN) layer 124 over the isolation dielectric layer 118. The gated graphene component 102 includes a graphitic layer 126 on the lower hBN layer 124. The graphitic layer 126 includes one or more layers of graphene, and may have a Bernal configuration, that is, each atomic layer of graphene may be offset from the atomic layers immediately above and below. The graphitic layer 126 has a channel region 128, a first contact region 130 adjacent to the channel region 128, and a second contact region 132 adjacent to the channel region 128.

The gated graphene component 102 includes a first connection 134 on the graphitic layer 126 in the first contact region 130, and a second connection 136 on the graphitic layer 126 in the second contact region 132. The first connection 134 and the second connection 136 may include one or more metallic elements suitable for precipitation of hBN and graphene, such as copper, nickel, and the like. Barrier metal caps 138 may be disposed on each of the first connection 134 and the second connection 136. The barrier metal caps 138 may include one or more materials which reduce diffusion of boron and nitrogen, such as titanium nitride or tantalum nitride. The barrier metal caps 138 may have thicknesses of, for example, 10 nanometers to 100 nanometers. The gated graphene component 102 of the instant example may include a patterned hBN layer 140 on the graphitic layer 126 in the channel region 128.

The semiconductor material 106 includes a backgate region 142 under the channel region 128. The backgate region 142 has a first conductivity type. In some versions of the instant example, the first conductivity type may be p-type, as depicted in FIG. 1. In other versions, the first conductivity type may be n-type. The semiconductor material 106 further includes a first contact field region 144 under the first contact region 130, and includes a second contact field region 146 under the second contact region 132. At least one of the first contact field region 144 and the second contact field region 146 has a second conductivity type that is opposite from the first conductivity type. In some versions of the instant example, the first contact field region 144 and the second contact field region 146 may both have the second conductivity type. In versions of the instant example in which the first conductivity type is p-type, the first contact field region 144 and the second contact field region 146 may both be n-type, as depicted in FIG. 1. In versions of the instant example in which the first conductivity type is n-type, the first contact field region 144 and the second contact field region 146 may both be p-type. The first contact field region 144 may have an average dopant density greater than $1 \times 10^{19}$ cm$^{-3}$, which may reduce depletion of the first contact field region 144 when a bias is applied to the first contact field region 144 relative to the first connection 134 during operation of the microelectronic device 100, which may in turn enable an increased electric field in the first contact field region 144, advantageously increasing the carrier density in the first contact field region 144. Similarly, the second contact field region 146 may have an average dopant density greater than $1 \times 10^{19}$ cm$^{-3}$, accruing a similar advantage.

The semiconductor material 106 may optionally include a well tap region 148 contacting the graphene component well 112. The well tap region 148 may have the same conductivity type as the graphene component well 112, with a higher average dopant density, to provide a low resistance connection to the backgate region 142 through the graphene component well 112.

The PMOS transistor 108 includes a p-type source region 150 and a p-type drain region 152 in the semiconductor material 106. In versions of the instant example in which the first contact field region 144 or the second contact field region 146 is p-type, that first contact field region 144 or second contact field region 146 which is p-type may have a dopant distribution that is substantially equal to a dopant distribution of the p-type source region 150, as a result of being formed concurrently. The NMOS transistor includes an n-type source region 154 and an n-type drain region 156. In versions of the instant example in which the first contact field region 144 or the second contact field region 146 is n-type, that first contact field region 144 or second contact field region 146 which is n-type may have a dopant distribution that is substantially equal to a dopant distribution of the n-type source region 154, as a result of being formed concurrently.

The gated graphene component 102 of the instant example may include contact spacers 158 on lateral surfaces of the first connection 134 and the second connection 136. The contact spacers 158 may include silicon dioxide, silicon nitride, silicon oxynitride, or the like. The gated graphene component 102 includes a gate dielectric layer 160 on the patterned hBN layer 140 over the channel region 128. The gate dielectric layer 160 may include silicon dioxide, silicon nitride, silicon oxynitride, aluminum oxide, boron nitride, hafnium oxide, tantalum oxide, zirconium oxide, or other dielectric material. The gate dielectric layer 160 may have a thickness of, for example, 1 nanometer to 20 nanometers. The gated graphene component 102 includes a gate 162 on the gate dielectric layer 160 over the channel region 128. The gate 162 may include polycrystalline silicon, aluminum, copper, titanium, titanium nitride, tantalum, tantalum nitride, metal silicide, or other electrically conductive material. The gate 162 is electrically isolated from the first connection 134 and the second connection 136 by the contact spacers 158.

The PMOS transistor 108 includes a PMOS gate 164 over the PMOS gate dielectric layer 120, and may include PMOS gate spacers 166 on lateral surfaces of the PMOS gate 164. The NMOS transistor 110 includes an NMOS gate 168 over the NMOS gate dielectric layer 122, and may include NMOS gate spacers 170 on lateral surfaces of the NMOS gate 168.

The microelectronic device 100 may include metal silicide 172 on exposed semiconductor material of the microelectronic device 100, including, for example, portions of the first contact field region 144, the second contact field region 146, the well tap region 148, the n-type source region 154, the n-type drain region 156, the p-type source region 150, the p-type drain region 152, the NMOS gate 168, and the PMOS gate 164. The metal silicide 172 may provide low resistance connections to the components of the microelectronic device 100. Components in the microelectronic device 100, including the gated graphene component 102, the PMOS transistor 108 and the NMOS transistor 110, may be laterally separated by field oxide 174. The field oxide 174 may have a shallow trench isolation (STI) structure, as depicted in FIG. 1, or may have a local oxidation of silicon (LOCOS) structure. Other structures for laterally separating the components in the microelectronic device 100 are within the scope of the instant example.

A dielectric layer 176 may be disposed over the substrate 104 and components in the microelectronic device 100, including the gated graphene component 102, the PMOS transistor 108, and the NMOS transistor 110. The dielectric layer 176 may be a pre-metal dielectric (PMD) layer, which may include one or more sub-layers of dielectric material, for example a PMD liner of silicon nitride, a layer of silicon dioxide-based material formed by a high density plasma or a chemical vapor deposition (CVD) process using tetraethyl orthosilicate (TEOS) and ozone, a layer of silicon dioxide-based material such as phosphorus silicate glass (PSG) or boron phosphorus silicate glass (BPSG), and a cap layer of silicon nitride, silicon oxynitride, silicon carbide or silicon carbide nitride. Other structures and compositions for the dielectric layer 176 are within the scope of the instant example.

Contacts 178 are disposed through the dielectric layer 176, on the metal silicide 172, if present, to make electrical connections to the components of the microelectronic device 100, including the gated graphene component 102, the PMOS transistor 108, and the NMOS transistor 110. The contacts 178 may include an adhesion liner of titanium, a barrier liner of titanium nitride, and a core metal of tungsten. Other structures and compositions for the contacts 178 are within the scope of the instant example. Contact to the semiconductor material 106 may be made by a backside contact 180 on the substrate 104 on a back surface of the substrate 104, opposite from the components of the microelectronic device 100, including the gated graphene component 102, the PMOS transistor 108, and the NMOS transistor 110. In another version of the instant example, the contacts 178 may be replaced with interconnects or other electrical connections.

During operation of the microelectronic device 100, the first contact field region 144, the second contact field region 146, the backgate region 142, and the gate 162 may all be biased independently to provide desired carrier densities in the first contact region 130, the second contact region 132, and the channel region 128. The first connection 134 and the second connection 136 may be biased relative to each other to provide a desired electric field in the graphitic layer 126 in the channel region 128. The backgate region 142 and the gate 162 may be biased to control current flow through the channel region 128. The backgate region 142 may be biased through the well tap region 148, for example in versions of the instant example which include the graphene component well 112, or versions in which the substrate 104 has an SOI structure. In versions of the instant example which do not have the graphene component well, the backgate region 142 may be biased through the backside contact 180. Biasing the first contact field region 144 and the second contact field region 146 independently of the backgate region 142 may enable high carrier densities in the first contact region 130 and the second contact region 132, independently of the carrier density in the channel region 128, which may advantageously reduce a total resistance of the gated graphene component 102.

Figure 2A:
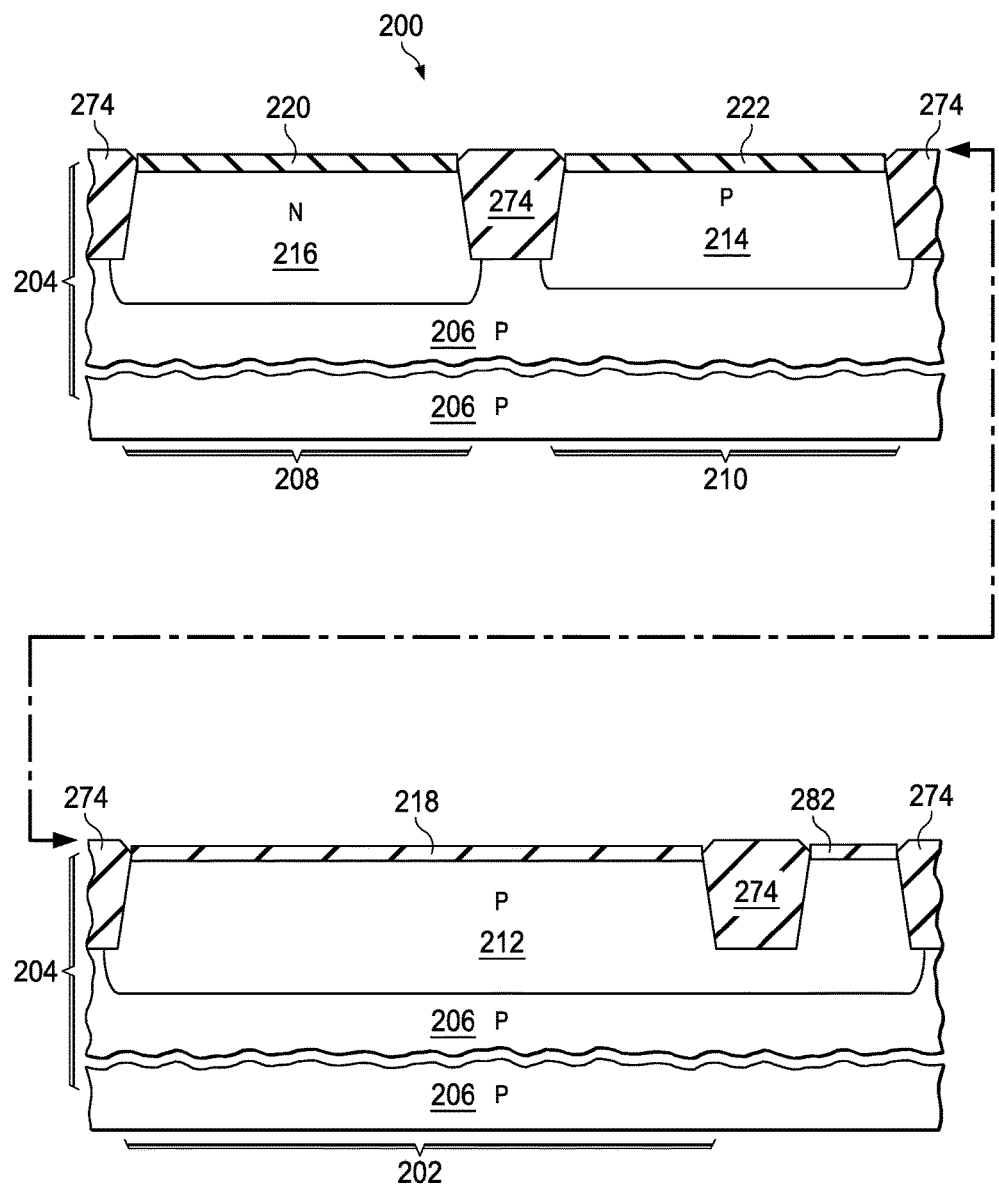
FIG. 2A through FIG. 2I are cross sections of a microelectronic device which includes a gated graphene component, depicted in stages of an example method of formation.

FIG. 2A through FIG. 2I are cross sections of a microelectronic device 200 which includes a gated graphene component 202, depicted in stages of an example method of formation. Referring to FIG. 2A, the microelectronic device 200 includes a substrate 204 having a semiconductor material 206 such as silicon, silicon carbide, gallium arsenide, gallium nitride, or the like. The substrate 204 may be a semiconductor wafer, an SOI wafer, or another semiconductor-containing substrate. The semiconductor material 206 may be p-type, as indicated in FIG. 2A, or may be n-type. The substrate 204 includes an area for the gated graphene component 202, an area for a PMOS transistor 208 and an area for an NMOS transistor 210.

Field oxide 274 may be formed in the substrate 204. The field oxide 274 may be formed, for example, by an STI process or a LOCOS process. An example STI process includes forming a CMP stop layer of silicon nitride over the substrate 204, etching isolation trenches through the CMP stop layer and into the substrate 204, and filling the isolation trenches with silicon dioxide using a plasma enhanced chemical vapor deposition (PECVD) process using TEOS, a high density plasma (HDP) process, a high aspect ratio process (HARP) using TEOS and ozone, an atmospheric pressure chemical vapor deposition (APCVD) process using silane, or a sub-atmospheric chemical vapor deposition (SACVD) process using dichlorosilane. Excess silicon dioxide is removed from over the CMP stop layer by an oxide chemical mechanical polish (CMP) process, and the CMP stop layer is subsequently removed, leaving the field oxide 274. An example LOCOS process includes forming a silicon nitride mask layer over a layer of LOCOS pad oxide over the substrate 204. The silicon nitride mask layer is removed in areas for the field oxide 274, exposing the LOCOS pad oxide. Silicon dioxide is formed in the areas exposed by the silicon nitride mask layer by thermal oxidation, to form the field oxide 274. The silicon nitride mask layer is subsequently removed, leaving the field oxide 274 in place.

An n-type well 216 may be formed in the substrate 204 in the area for the PMOS transistor 208. The n-type well 216 may be formed by implanting n-type dopants such as phosphorus into the semiconductor material 206 in one or more implant steps at energies from 150 kiloelectron volts (keV) to 450 keV, at a cumulative dose of $1 \times 10^{12}$ cm$^{-2}$ to $1 \times 10^{14}$ cm$^{-2}$, followed by a thermal anneal and activation operation.

A p-type well 214 may be formed in the substrate 204 in the area for the NMOS transistor 210. The p-type well 214 may be formed by implanting p-type dopants such as boron into the semiconductor material 206 in one or more implant steps at energies from 50 kiloelectron volts (keV) to 250 keV, at a cumulative dose of $1 \times 10^{12}$ cm$^{-2}$ to $1 \times 10^{14}$ cm$^{-2}$, followed by a thermal anneal and activation operation.

A graphene component well 212 may be formed in the substrate 204 in the area for the gated graphene component 202. In the instant example, the graphene component well 212 may be p-type, and may be formed concurrently with the p-type well 214. Alternatively, the graphene component well 212 may be n-type, and may be formed concurrently with the n-type well 216. Forming the graphene component well 212 concurrently with the p-type well 214 or the n-type well 216 may advantageously reduce fabrication cost and complexity of the microelectronic device 200 compared to forming the graphene component well 212 separately.

A PMOS gate dielectric layer 220 is formed on the substrate 204 in the area for the PMOS transistor 208. An NMOS gate dielectric layer 222 is formed on the substrate 204 in the area for the NMOS transistor 210. An isolation dielectric layer 218 is formed on the substrate 204 in the area for the gated graphene component 202. A sacrificial oxide layer 282 may be formed on the substrate 204 in an area for a connection to the graphene component well 212. The PMOS gate dielectric layer 220, the NMOS gate dielectric layer 222, the isolation dielectric layer 218, and the sacrificial oxide layer 282 may include silicon dioxide, silicon oxynitride, aluminum oxide, hafnium oxide, tantalum oxide zirconium oxide, or other dielectric materials suitable for gate dielectric layers, and may be 1 nanometer to 10 nanometers thick. Any combination of the PMOS gate dielectric layer 220, the NMOS gate dielectric layer 222, the isolation dielectric layer 218, and the sacrificial oxide layer 282 may be formed concurrently, advantageously reducing fabrication cost and complexity of the microelectronic device 200 compared to forming the layers 220, 222, 218, and 282 separately.

Figure 2B:
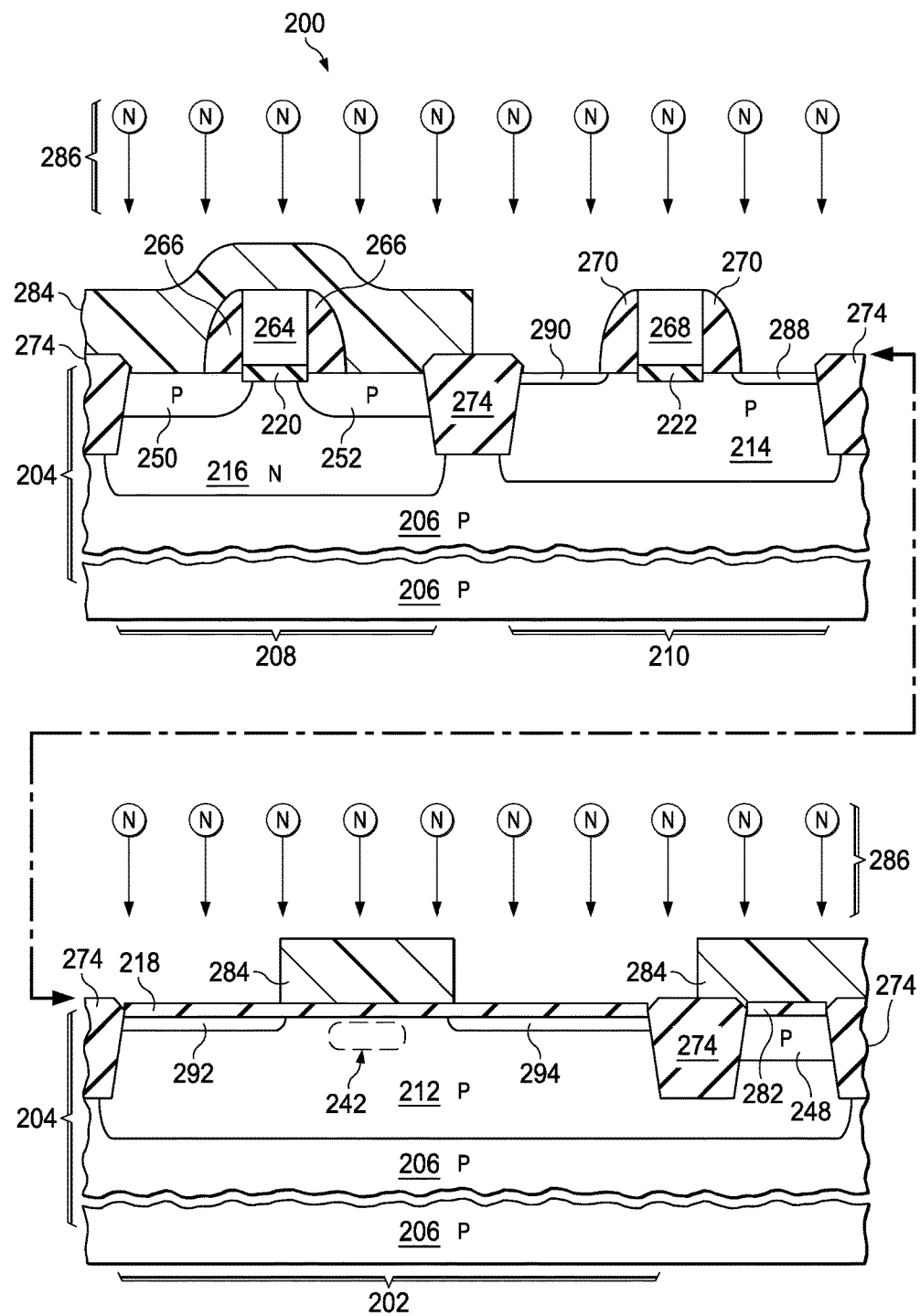

Referring to FIG. 2B, a PMOS gate 264 is formed on the PMOS gate dielectric layer 220. An NMOS gate 268 is formed on the NMOS gate dielectric layer 222. A portion or all of the PMOS gate 264 may be formed concurrently with a portion or all of the NMOS gate 268. P-type dopants may be implanted into the substrate 204 adjacent to the PMOS gate 264, after the PMOS gate 264 is formed, to form p-type source/drain extensions of the PMOS transistor 208. N-type dopants may be implanted into the substrate 204, extending partway under the PMOS gate 264, after the PMOS gate 264 is formed, to form n-type halo regions of the PMOS transistor 208. Similarly, n-type dopants may be implanted into the substrate 204 adjacent to the NMOS gate 268, after the NMOS gate 268 is formed, to form n-type source/drain extensions of the NMOS transistor 210. P-type dopants may be implanted into the substrate 204, extending partway under the NMOS gate 268, after the NMOS gate 268 is formed, to form p-type halo regions of the NMOS transistor 210.

Subsequently, PMOS gate sidewall spacers 266 are formed on lateral surfaces of the PMOS gate 264, and NMOS gate sidewall spacers 270 are formed on lateral surfaces of the NMOS gate 268. A portion or all of the PMOS gate sidewall spacers 266 may be formed concurrently with a portion or all of the NMOS gate sidewall spacers 270. The PMOS gate sidewall spacers 266 and the NMOS gate sidewall spacers 270 may include one or more layers of dielectric material such as silicon dioxide or silicon nitride.

Subsequently, additional p-type dopants such as boron, and optionally gallium or indium, are implanted into the substrate 204 in the area for the PMOS transistor 208 and in the area for the connection to the graphene component well 212. The substrate 204 is subsequently annealed so as to activate the implanted p-type dopants, forming a p-type source region 250 and a p-type drain region 252 in the substrate 204 in the area for the PMOS transistor 208, and to form a well tap region 248 in the substrate 204 in the area for the connection to the graphene component well 212. The additional p-type dopants may be implanted at a cumulative dose of $1 \times 10^{14}$ cm$^{-2}$ to $1 \times 10^{16}$ cm$^{-2}$, to provide an average dopant density greater than $1 \times 10^{19}$ cm$^{-3}$, in the p-type source region 250 and the p-type drain region 252.

An implant mask 284 is formed over the substrate 204 so as to expose areas for a first contact field region and a second contact field region, both in the area for the gated graphene component 202, and to expose the area for the NMOS transistor 210, and to cover an area for a backgate region 242 in the substrate 204 in the area for the gated graphene component 202, the area for the PMOS transistor 208, and the area for the connection to the graphene component well 212. The implant mask 284 may include photoresist, formed by a photolithographic process, and may further include an anti-reflection material such as an organic bottom anti-reflection coating (BARC). Additional n-type dopants 286 such as phosphorus, arsenic, and optionally antimony, are implanted into the substrate 204 where exposed by the implant mask 284. The additional n-type dopants 286 may be implanted in one or more implant steps at energies from 2 keV to 40 keV, at a cumulative dose of $1 \times 10^{14}$ cm$^{-2}$ to $1 \times 10^{16}$ cm$^{-2}$. The implanted n-type dopants 286 form a source implanted region 288 and a drain implanted region 290 in the area for the NMOS transistor 210, and form a first contact field implanted region 292 and a second contact field implanted region 294 in the area for the gated graphene component 202. Implanting the additional n-type dopants 286 at a cumulative dose of $1 \times 10^{14}$ cm$^{-2}$ to $1 \times 10^{16}$ cm$^{-2}$ may provide an average dopant density greater of $1 \times 10^{19}$ cm$^{-3}$, which may accrue the advantage disclosed in reference to FIG. 1.

The implant mask 284 is subsequently removed. The implant mask 284 may be removed by exposure to oxygen radicals, for example, in an asher process. Residue from the exposure to oxygen radicals may be removed by a wet clean process, such as an aqueous mixture of hydrogen peroxide and ammonium hydroxide.

Figure 2C:
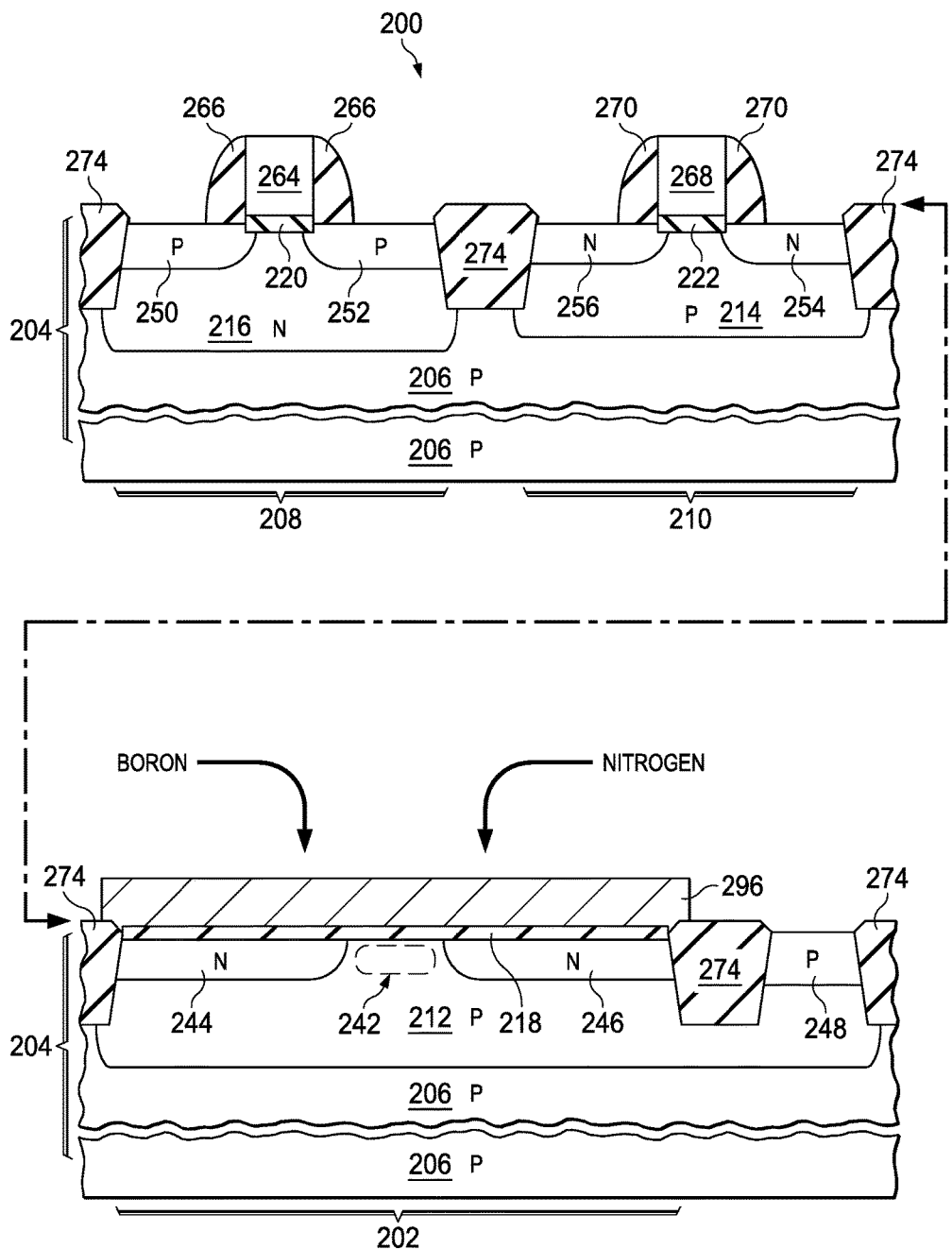

Referring to FIG. 2C, a thermal anneal process is performed which anneals the substrate 204 in the source implanted region 288, the drain implanted region 290, the first contact field implanted region 292, and the second contact field implanted region 294 of FIG. 2B, and activates the implanted n-type dopants in the source implanted region 288, the drain implanted region 290, the first contact field implanted region 292, and the second contact field implanted region 294 to form an n-type source region 254 and an n-type drain region 256 in the substrate 204 in the area for the NMOS transistor 210, and to form a first contact field region 244 and a second contact field region 246 in the substrate 204 in the area for the gated graphene component 202. The first contact field region 244 and the second contact field region 246 are adjacent to the backgate region 242.

A first metal layer 296 may be formed on the isolation dielectric layer 218. The first metal layer 296 includes one or more metals suitable for subsequent precipitation of an hBN layer, for example, cobalt, nickel, copper, ruthenium, rhodium, palladium, silver, rhenium, iridium, platinum, gold, or any combination thereof. These metals are not an exhaustive list, and are provided by way of examples. The first metal layer (296) may include a homogeneous alloy or mixture of two or more different metals. The first metal layer (296) may include a layered structure of two or more layers with different metals, for example a copper/nickel/copper stack. The first metal layer (296) may be formed, for example, by a sputter process, an evaporation process, a CVD process, a metal organic chemical vapor deposition (MOCVD) process, or an atomic layer deposition (ALD) process. A thickness of the first metal layer 296 is appropriate for precipitation of an hBN layer onto the isolation dielectric layer 218, and thus may be selected based on the composition of the first metal layer 296. For example, the first metal layer 296 may have a thickness of 50 nanometers to 500 nanometers. The first metal layer 296 may be patterned, so as to extend only over the area for the gated graphene component 202, as depicted in FIG. 2C. Alternately, the first metal layer 296 may extend over the whole substrate 204.

Boron, denoted as "Boron" in FIG. 2C, may be introduced into the first metal layer 296 in sufficient quantity to form a saturation condition of boron in the first metal layer 296 at a temperature suitable for diffusion of the boron and the nitrogen in the first metal layer 296 and precipitation of the hBN layer onto the isolation dielectric layer 218, for example, 400° C. to 800° C. Nitrogen, denoted as "Nitrogen" in FIG. 2C, may be introduced into the first metal layer 296 in sufficient quantity to form a saturation condition of nitrogen in the first metal layer 296 at the same temperature suitable for diffusion of the boron and the nitrogen and precipitation of the hBN layer onto the isolation dielectric layer 218. The boron and the nitrogen may be introduced into the first metal layer 296 by any of several methods, including, for example, ion implantation, exposure to boron-containing gas reagents and nitrogen-containing gas reagents at an elevated temperature, or deposition of a boron nitride layer on the first metal layer 296.

Areas of the microelectronic device 200, including the areas for the PMOS transistor 208 and the NMOS transistor 210, that are outside of the area for the gated graphene component 202 may be shielded from the process operations disclosed in reference to FIG. 2C and subsequent steps, for example by a shield layer of silicon dioxide, not shown, or other material. The shield layer may be removed after the gated graphene component 202 is formed. Other methods of protecting the areas of the microelectronic device 200 that are outside of the area for the gated graphene component 202 are within the scope of the instant example.

Figure 2D:
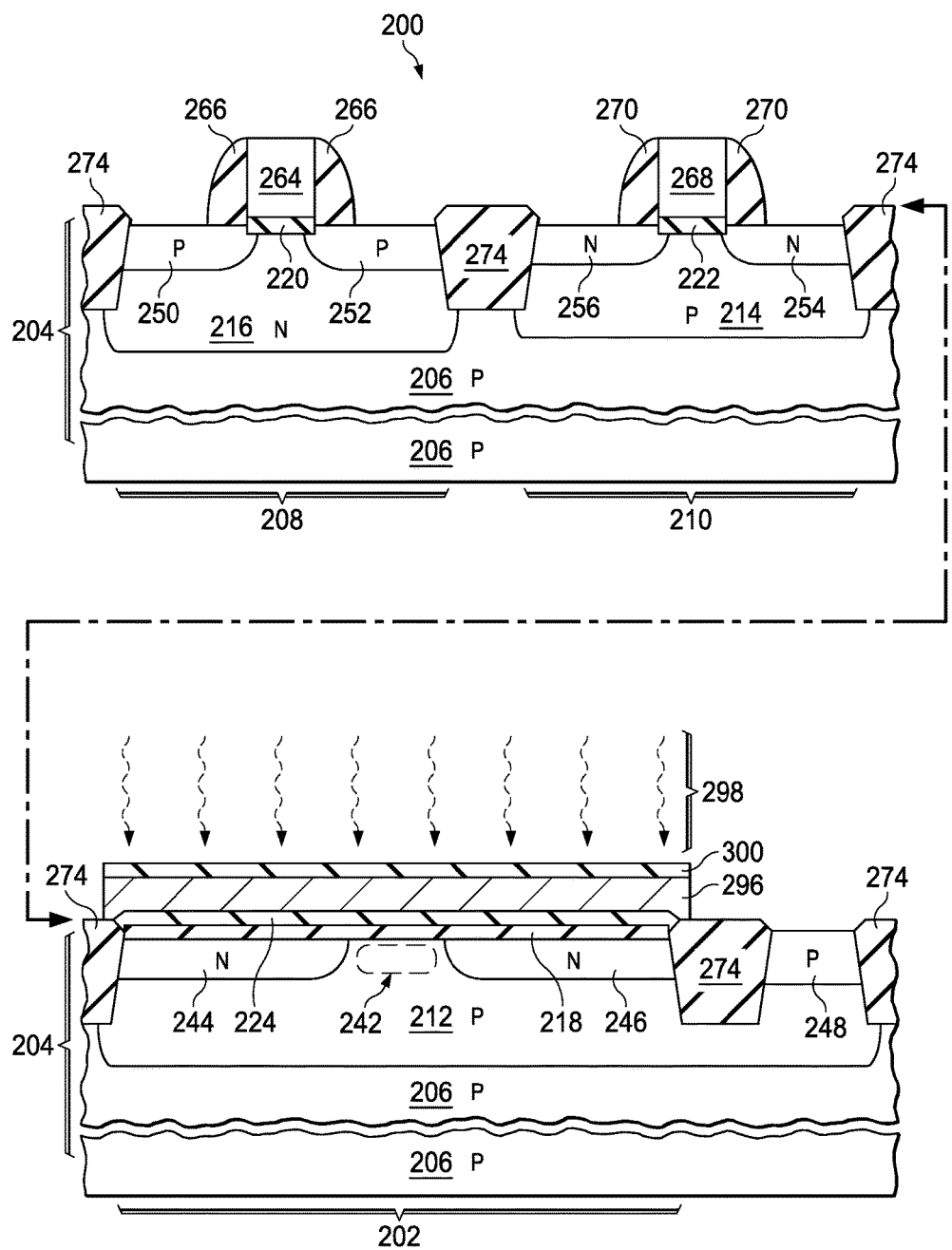

Referring to FIG. 2D, the first metal layer 296 may be heated to a temperature at which the boron and nitrogen attain a saturation condition. The first metal layer 296 may be heated by a first radiant heat process 298, as indicated in FIG. 2D, by a hotplate process, by a furnace process, or other heating process. The first metal layer 296 is subsequently cooled, resulting in diffusion of the boron and the nitrogen to surfaces of the first metal layer 296 and precipitation of a lower hBN layer 224 on the isolation dielectric layer 218. The lower hBN layer 224 may be, for example, 1 to 5 atomic layers thick. An upper hBN layer 300 may also be precipitated on a top surface of the first metal layer 296, opposite from the lower hBN layer 224. The upper hBN layer 300 may be removed, either separately, or together with the first metal layer 296.

Figure 2E:
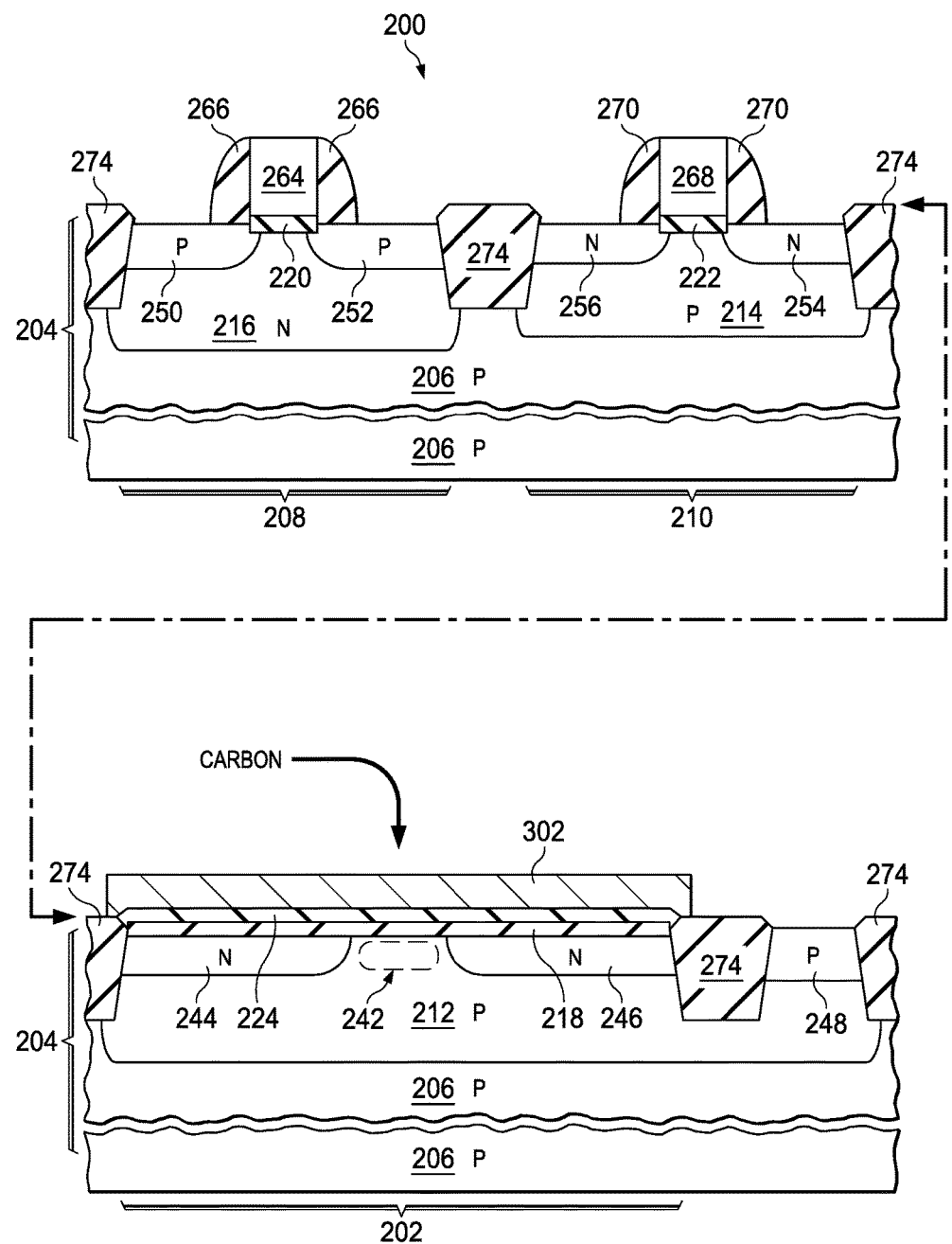

Referring to FIG. 2E, a second metal layer 302 may be disposed on the lower hBN layer 224. In some versions of the instant example, the second metal layer 302 may be the first metal layer 296 of FIG. 2D. In other versions, the second metal layer 302 may include a portion of the first metal layer 296, and may optionally include additional metal. In further versions, the first metal layer 296 may be removed before forming the second metal layer 302. The second metal layer 302 includes one or more metals suitable for subsequent precipitation of a graphitic layer. The second metal layer 302 may have a composition, layer structure, and thickness similar to the first metal layer 296.

Carbon, denoted as "Carbon" in FIG. 2E, may be introduced into the second metal layer 302 in sufficient quantity to form a saturation condition of carbon in the second metal layer 302 at a temperature suitable for diffusion of the carbon in the second metal layer 302 and precipitation of the graphitic layer onto the lower hBN layer 224, for example, 400° C. to 800° C. The carbon may be introduced into the second metal layer 302 by any of several methods, including, for example, ion implantation, exposure to carbon-containing gas reagents at an elevated temperature, or deposition of an amorphous carbon layer on the second metal layer 302.

Figure 2F:
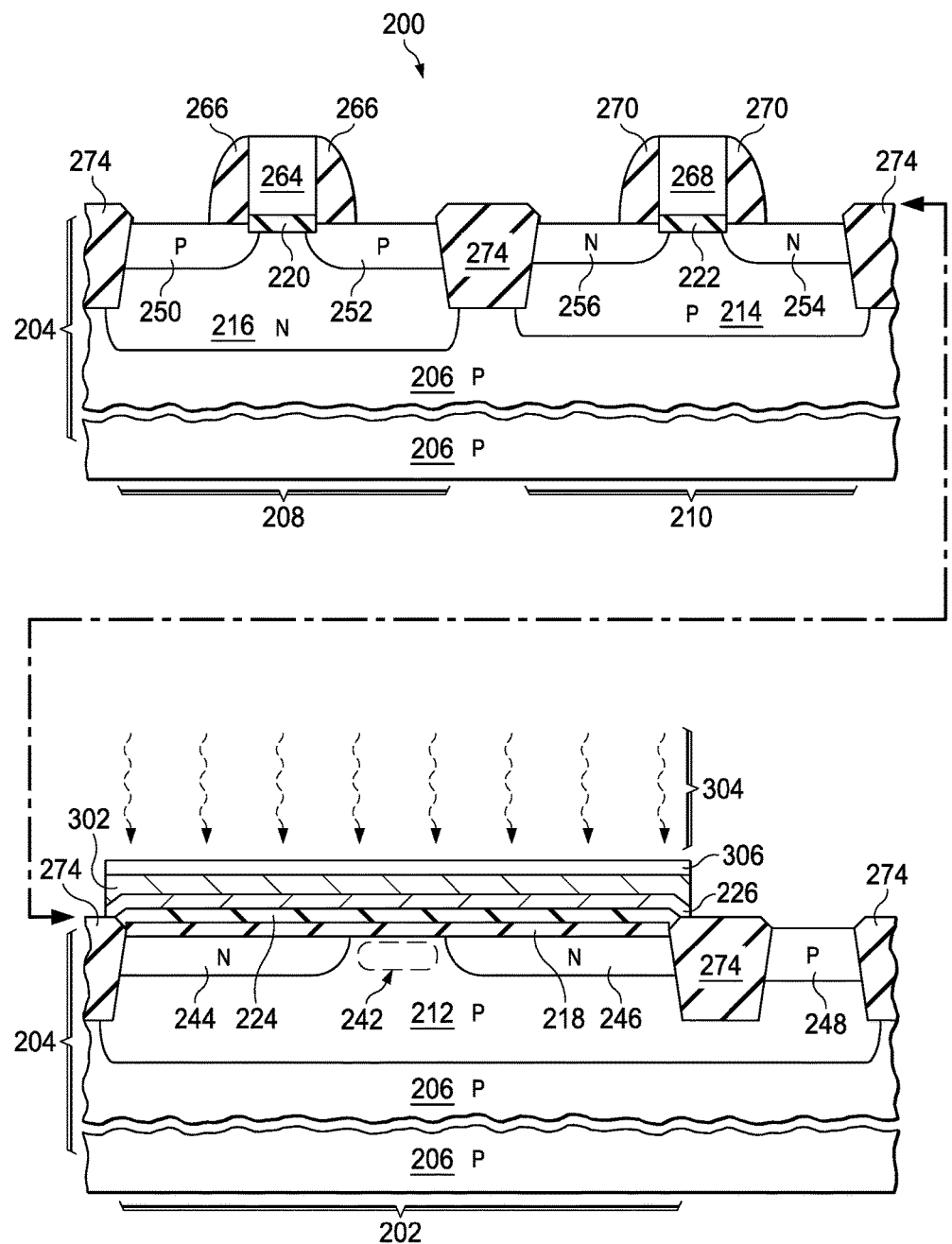

Referring to FIG. 2F, the second metal layer 302 may be heated to a temperature at which the carbon attains a saturation condition. The second metal layer 302 may be heated by a second radiant heat process 304, as indicated in FIG. 2F, or by another heating process. The second metal layer 302 is subsequently cooled, resulting in diffusion of the carbon to surfaces of the second metal layer 302 and precipitation of a graphitic layer 226 on the lower hBN layer 224. The graphitic layer 226 may have a Bernal configuration. An upper graphitic layer 306 may also be precipitated on a top surface of the second metal layer 302, opposite from the graphitic layer 226. The upper graphitic layer 306 may optionally be removed.

Figure 2G:
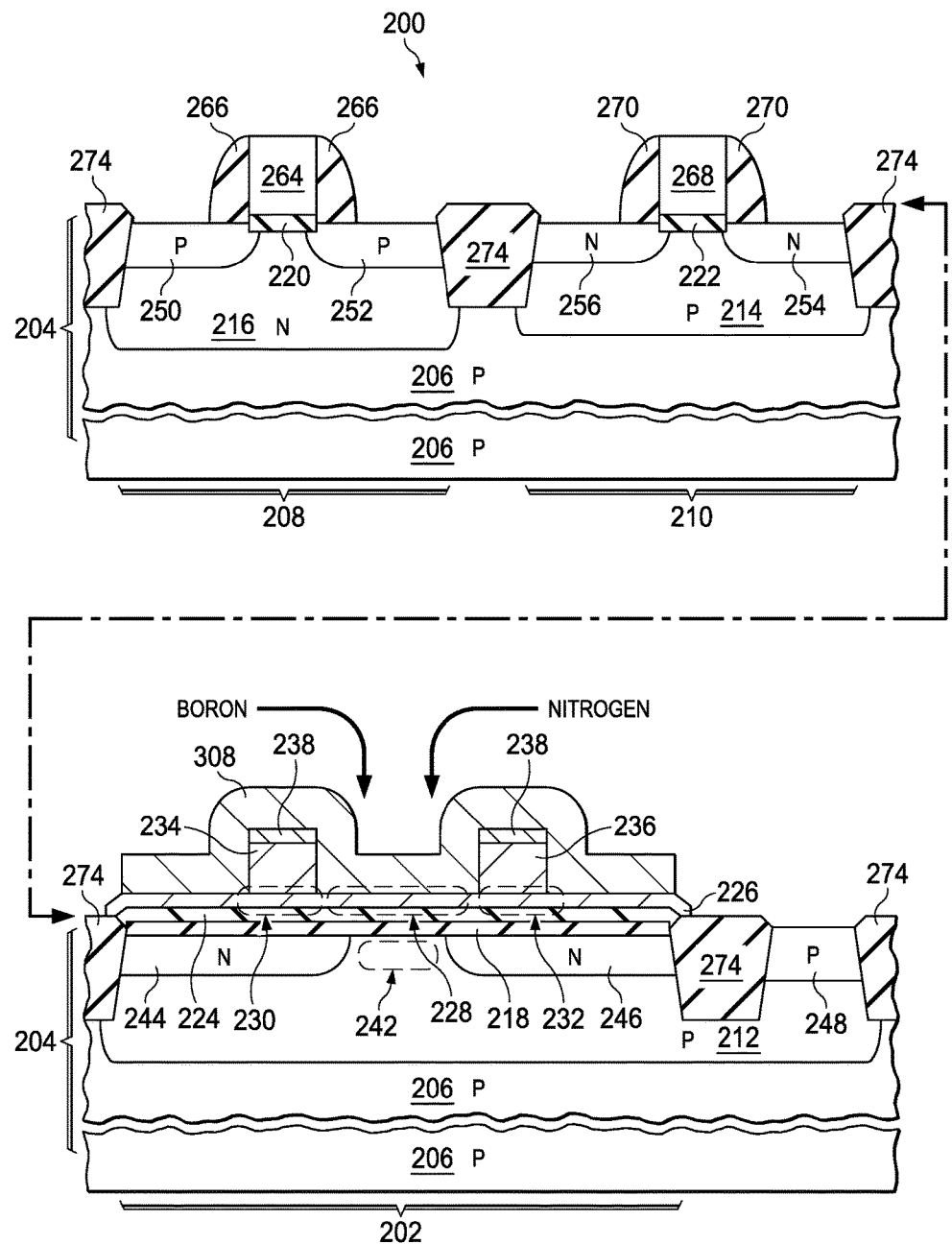

Referring to FIG. 2G, a first connection 234 is formed on the graphitic layer 226 in a first contact region 230 of the graphitic layer 226, and a second connection 236 is formed on the graphitic layer 226 in a second contact region 232 of the graphitic layer 226. The first connection 234 and the second connection 236 may include a portion of the second metal layer 302 of FIG. 2F. The first connection 234 and the second connection 236 may be formed concurrently. The first connection 234 and the second connection 236 may have barrier caps 238 of material which reduces diffusion of boron, for example, titanium nitride or tantalum nitride.

A third metal layer 308 may be formed over the first connection 234 and the second connection 236, and on the graphitic layer 226 where exposed by the first connection 234 and the second connection 236, including over the channel region 228. The third metal layer 308 includes one or more metals suitable for subsequent precipitation of an hBN layer. The third metal layer 308 may have a composition, layer structure, and thickness similar to those properties described in reference to the first metal layer 296 of FIG. 2C.

Boron, denoted as "Boron" in FIG. 2G, and nitrogen, denoted as "Nitrogen" in FIG. 2G, may be introduced into the third metal layer 308 in sufficient quantity to form saturation conditions of boron and nitrogen in the third metal layer 308 at a temperature suitable for diffusion of the boron and the nitrogen in the third metal layer 308 and precipitation of a layer onto the graphitic layer 226, for example, 400° C. to 800° C. The boron and the nitrogen may be introduced into the first metal layer 296 by any of the methods described in reference to FIG. 2C.

Figure 2H:
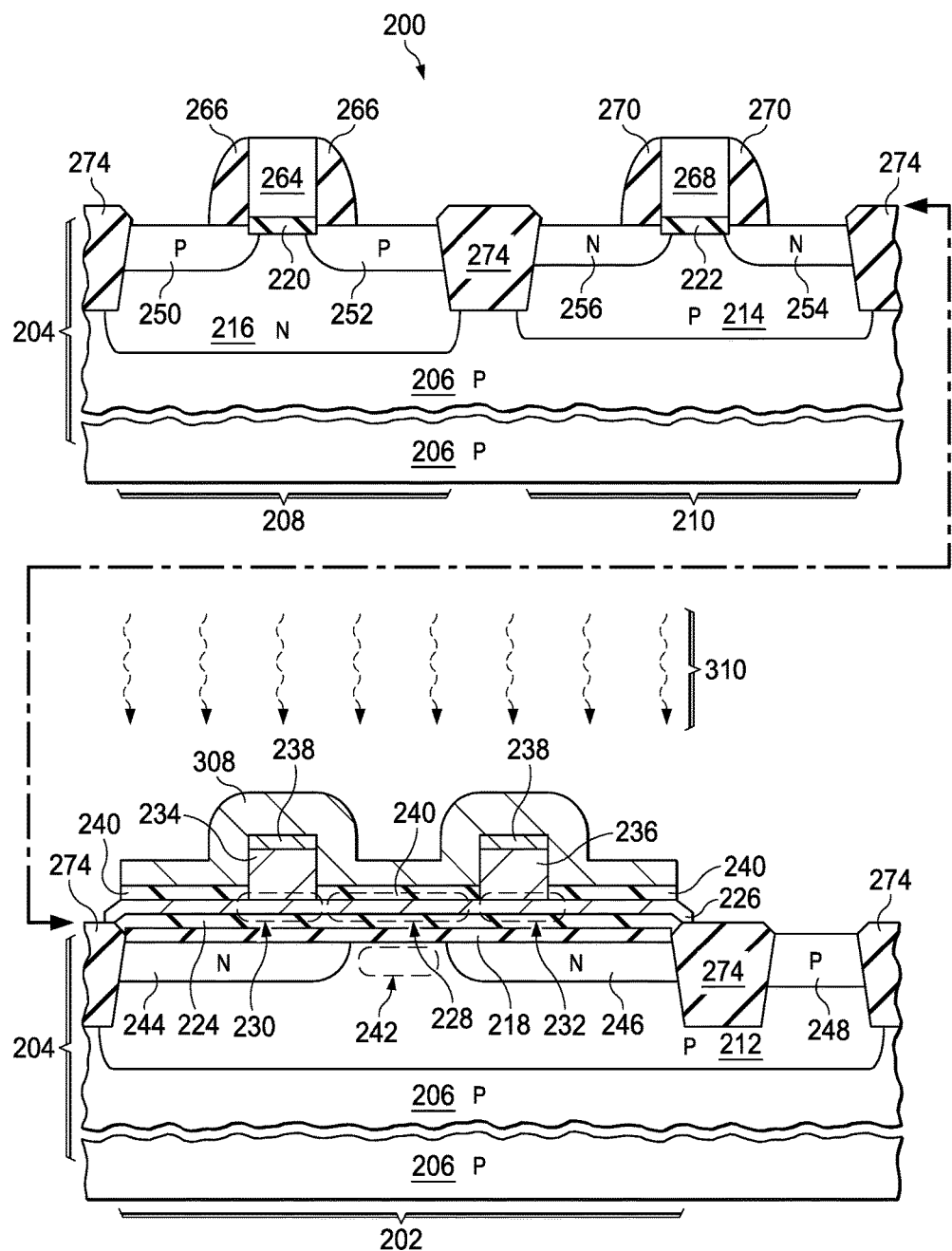

Referring to FIG. 2H, the third metal layer 308 may be heated to a temperature at which the boron and nitrogen attain a saturation condition. The third metal layer 308 may be heated to the temperature to which the first metal layer 296 of FIG. 2D was heated. The third metal layer 308 may be heated by a third radiant heat process 310, as indicated in FIG. 2D, or by another heating process. The third metal layer 308 is subsequently cooled, resulting in diffusion of the boron and the nitrogen to surfaces of the third metal layer 308 and precipitation of a patterned hBN layer 240 on the graphitic layer 226 in the channel region 228. The barrier caps 238 block formation of hBN under the first connection 234 and the second connection 236. The patterned hBN layer 240 may be, for example, 1 to 5 atomic layers thick. A second hBN layer, not shown, may also be precipitated on a top surface of the third metal layer 308, opposite from the patterned hBN layer 240, and on the barrier caps 238. The third metal layer 308, along with the second hBN layer, is subsequently removed, leaving the patterned hBN layer 240 in place.

Figure 2I:
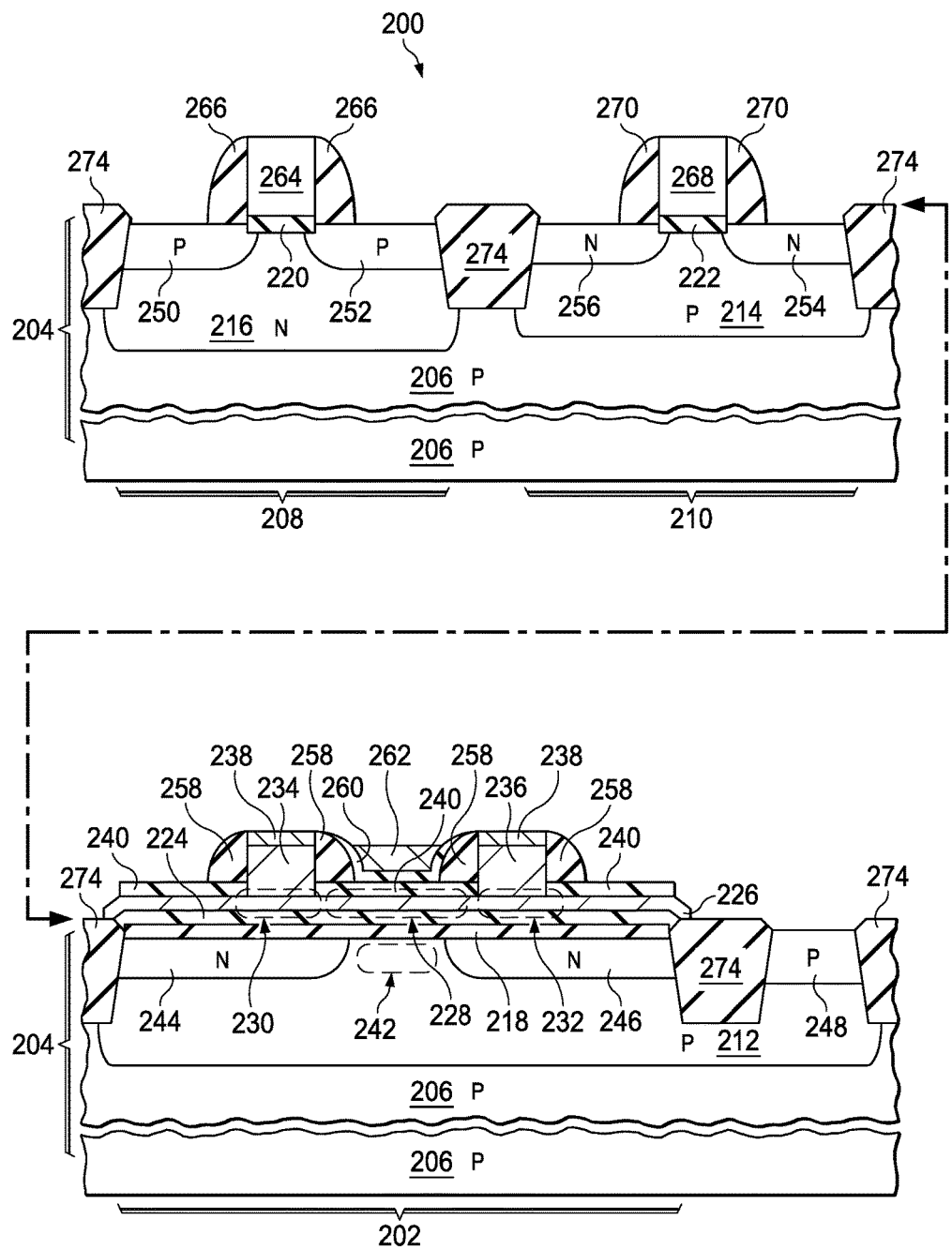

Referring to FIG. 2I, contact spacers 258 may be formed on lateral surfaces of the first connection 234 and the second connection 236. The contact spacers 258 may be formed by forming a conformal layer of dielectric material such as silicon dioxide or silicon nitride over the first connection 234 and the second connection 236, and removing the conformal layer over the channel region 228 by an anisotropic etch process, such as a reactive ion etch (RIE) process.

A gate dielectric layer 260 of the gated graphene component 202 may be formed over the patterned hBN layer 240. The gate dielectric layer 260 may extend onto the contact spacers 258. The gate dielectric layer 260 may include the materials disclosed in reference to FIG. 1. Portions or all of the gate dielectric layer 260 may be formed by a CVD process, an ALD process, or other dielectric thin film process. The gate dielectric layer 260 may be formed as a blanket dielectric layer on the microelectronic device 200 and subsequently patterned by a mask and etch process to remove the blanket dielectric layer from areas outside of the gated graphene component 202.

A gate 262 of the gated graphene component 202 is formed over the gate dielectric layer 260 over the channel region 228. The gate 262 may include the materials disclosed with regard to the gate 162 in reference to FIG. 1. The gate 262 may be formed by an evaporation process, a sputter process, an ALD process, a metal organic chemical vapor deposition (MOCVD) process, or other suitable metal thin film process. The gate 262 is formed so as to be electrically isolated from the first connection 234 and the second connection 236 by the contact spacers 258. The gate 262 may be formed as a blanket metal layer on the microelectronic device 200 and subsequently patterned by a mask and etch process to remove the blanket metal layer from areas outside of the gated graphene component 202.

Formation of the microelectronic device 200 continues with formation of metal silicide, not shown in FIG. 2I, on exposed semiconductor material of the microelectronic device 200, including, for example, portions of the first contact field region 244, the second contact field region 246, the well tap region 248, the n-type source region 254, the n-type drain region 256, the p-type source region 250, the p-type drain region 252, the NMOS gate 268, and the PMOS gate 264. Subsequently, a dielectric layer, not shown in FIG. 2I, is formed on the microelectronic device 200 and contacts, not shown in FIG. 2I, are formed through the dielectric layer, to provide the structure of FIG. 1.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
a substrate having a semiconductor material;
a gated graphene component, the gated graphene component including:
a graphitic layer including at least one layer of graphene over the substrate, the graphitic layer having a channel region, a first contact region adjacent to the channel region and a second contact region adjacent to the channel region; and
a gate over the channel region;
a first connection on the graphitic layer in the first contact region;
a second connection on the graphitic layer in the second contact region;
a backgate region in the semiconductor material under the channel region, the backgate region having a first conductivity type;
a first contact field region in the semiconductor material under the first contact region of the graphitic layer; and
a second contact field region in the semiconductor material under the second contact region of the graphitic layer, wherein the graphitic layer is isolated from the backgate region, the first contact field region, and the second contact field region, and wherein at least one of the first contact field region and the second contact field region has a second, opposite, conductivity type.

2. The microelectronic device of claim 1, wherein the at least one of the first contact field region and the second contact field region has an average dopant density greater than $1 \times 10^{19}$ cm$^{-3}$.

3. The microelectronic device of claim 1, wherein the backgate region is p-type, the first contact field region is n-type, and the second contact field region is n-type.

4. The microelectronic device of claim 3, wherein the semiconductor material includes primarily silicon, and further comprising an n-channel metal oxide semiconductor (NMOS) transistor.

5. The microelectronic device of claim 4, wherein a dopant distribution of the first contact field region is substantially equal to a dopant distribution of an n-type source region of the NMOS transistor.

6. The microelectronic device of claim 4, further comprising a p-channel metal oxide semiconductor (PMOS) transistor.

7. The microelectronic device of claim 1, wherein the gated graphene component further includes an isolation dielectric layer on the backgate region, the first contact field region, and the second contact field region, wherein the graphitic layer is isolated from the backgate region, the first contact field region, and the second contact field region by the isolation dielectric layer.

8. The microelectronic device of claim 7, further including a metal oxide semiconductor (MOS) transistor having a gate dielectric layer, wherein a thickness and a composition of the isolation dielectric layer are substantially equal to a thickness and a composition of the gate dielectric layer.

9. The microelectronic device of claim 1, wherein the gated graphene component further includes a lower hexagonal boron nitride (hBN) layer under the graphitic layer, the graphitic layer being disposed directly on the lower hBN layer.

10. The microelectronic device of claim 1, wherein the gated graphene component further includes:
a patterned hBN layer directly on the graphitic layer over the channel region, opposite from the backgate region; and
a gate over the patterned hBN layer.

11. A method of forming a microelectronic device, comprising:
providing a substrate including a semiconductor material, the semiconductor material including a backgate region in the semiconductor material, the backgate region having a first conductivity type;

forming a first contact field region in the semiconductor material adjacent to the backgate region;

forming a second contact field region in the semiconductor material adjacent to the backgate region, wherein at least one of the first contact field region and the second contact field region has a second, opposite, conductivity type;

forming a graphitic layer of a gated graphene component over the substrate, the graphitic layer including at least one layer of graphene, the graphitic layer extending over the backgate region, the first contact field region, and the second contact field region, wherein the graphitic layer is isolated from the backgate region, the first contact field region, and the second contact field region;

forming a first connection on the graphitic layer over the first contact field region; and forming a second connection on the graphitic layer over the second contact field region.

12. The method of claim 11, further comprising forming a source region of a metal oxide semiconductor (MOS) transistor having the second conductivity type concurrently with the at least one of the first contact field region and the second contact field region having the second conductivity type.

13. The method of claim 11, wherein forming the at least one of the first contact field region and the second contact field region having the second conductivity type includes implanting dopants of the second conductivity type at a cumulative dose of $1\times10^{14}$ cm$^2$ to $1\times10^{16}$ cm$^{-2}$.

14. The method of claim 11, wherein forming the at least one of the first contact field region and the second contact field region having the second conductivity type is performed so that the at least one of the first contact field region and the second contact field region having the second conductivity type has an average dopant density greater than $1\times10^{19}$ cm$^{-3}$.

15. The method of claim 11, further comprising forming an isolation dielectric layer over the substrate, so that the graphitic layer is isolated from the backgate region, the first contact field region, and the second contact field region by the isolation dielectric layer.

16. The method of claim 15, further comprising forming a gate dielectric layer of an MOS transistor concurrently with the isolation dielectric layer.

17. The method of claim 11, wherein the semiconductor material includes primarily silicon.

18. The method of claim 11, further comprising forming a lower hexagonal boron nitride (hBN) layer before forming the graphitic layer, so that the graphitic layer is formed directly on the lower hBN layer.

19. The method of claim 11, further comprising forming a patterned hBN layer directly on the graphitic layer over the backgate region.

20. The method of claim 11, further comprising forming a gate over the graphitic layer over the channel region.

* * * * *